(12) United States Patent
Park et al.

(10) Patent No.: US 7,282,912 B2
(45) Date of Patent: Oct. 16, 2007

(54) NMR MEASUREMENT METHOD AND APPARATUS UTILIZING NYQUIST FREQUENCY CHANGES

(75) Inventors: Minseok Park, Hitachinaka (JP); Shuya Hagiwara, Mito (JP); Hideta Habara, Musashino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/330,207

(22) Filed: Jan. 12, 2006

(65) Prior Publication Data

US 2006/0158186 A1 Jul. 20, 2006

(30) Foreign Application Priority Data

Jan. 14, 2005 (JP) ............................. 2005-007346

(51) Int. Cl.
*G01V 3/00* (2006.01)
(52) U.S. Cl. .................................................... 324/307
(58) Field of Classification Search ................ 324/307, 324/309
See application file for complete search history.

(56) References Cited

U.S. PATENT DOCUMENTS

| | | | | |
|---|---|---|---|---|
| 6,045,515 A | * | 4/2000 | Lawton | ............. 600/558 |
| 6,144,873 A | * | 11/2000 | Madore et al. | ............. 600/410 |
| 6,213,956 B1 | * | 4/2001 | Lawton | ............. 600/558 |
| 7,106,478 B2 | * | 9/2006 | Takano | ............. 358/3.26 |

FOREIGN PATENT DOCUMENTS

JP 2006-138666 6/2006

OTHER PUBLICATIONS

Removal of F1 baseline distortion and optimization of folding in multidimensional NMR spectra, Journal and Magnetic Resonance, vol. 91, pp. 174-178 (1991).
Chapter 4, Multidimensional NMR spectroscopy, pp. 227-236 (Academic Press, 1995).

* cited by examiner

*Primary Examiner*—Brij Shrivastav
*Assistant Examiner*—Dixomara Vargas
(74) *Attorney, Agent, or Firm*—Antonelli, Terry, Stout & Kraus, LLP.

(57) ABSTRACT

In an NMR measurement method using an NMR apparatus which converts a received signal to digital data using an analog/digital converter and performs a spectral analysis, a folding and aliasing count is decided from a variation in a peak frequency and frequency discrimination is performed. More specifically, a Nyquist frequency is changed to cause a variation of the peak frequency. Since the Nyquist frequency is inversely proportional to an increment of an evolution time t1 which is a feature of multi-dimensional NMR, the Nyquist frequency can be changed by changing the increment of the evolution time. Furthermore, the Nyquist frequency is changed in such a way that a ratio between different Nyquist frequencies is not a ratio between natural numbers n1 and n2 which are greater than 0 and smaller than or equal to the maximum folding and aliasing count.

10 Claims, 8 Drawing Sheets

EXAMPLE OF FOLDING AND ALIASING (UBIQUITIN PROTEIN, HSQC SEQUENCE)

1-TIME FOLDING AND ALIASING $N \rightarrow N' = N/2$

2-TIME FOLDING AND ALIASING $N' \rightarrow N'' = N'/2$

NMR MEASUREMENT METHOD AND APPARATUS UTILIZING NYQUIST FREQUENCY CHANGES

BACKGROUND OF THE INVENTION

The present invention relates to an NMR measurement method and apparatus for the same.

An NMR apparatus is an analyzer which irradiates predetermined atomic nucleus in a sample placed in a static magnetic field with a magnetic field pulse of a radio frequency and detects an NMR signal from the predetermined atomic nucleus after a predetermined time. In NMR spectrometry in recent years, multi-dimensional NMR measurement is widely conducted. The multi-dimensional NMR measurement displays an NMR signal in a frequency space having two or more frequency axes, and thereby improves resolution compared to one-dimensional NMR measurement, facilitates a spectral analysis and has an advantage of being able to elucidate interaction between atomic nuclear spins. This advantage is particularly important for NMR measurement targeted at a high polymer such as protein having a large molecular weight and complex spectrum.

FIG. 1 and FIG. 2 show schematic diagrams of 2-dimensional NMR measurement as an example of multi-dimensional NMR measurement. 3-dimensional or higher multi-dimensional measurement is an extension of 2-dimensional measurement and does not include any new concept, and therefore separate explanations will be omitted. FIG. 1 shows a general configuration of a pulse sequence (hereinafter referred to as "2-dimensional pulse sequence") used for 2-dimensional NMR measurement. A two-dimensional pulse sequence consists of five periods; preparation period, evolution period, mixing period, acquisition period and relaxation period.

Of the five periods, the preparation period and mixing period each include irradiation of one or more magnetic field pulses. The evolution period is a delay time from the preparation period to the mixing period and normally expressed as t1 and called an "evolution period." The acquisition period is a period during which an NMR signal is detected by the above described reception system and normally expressed as t2. Execution of a pulse sequence having one-time acquisition period is generally called "scan" and used as the unit for measuring the number of times NMR measurement is performed. The relaxation period is a waiting time (period) until the atomic nucleus returns to its original state before the irradiation of the pulse sequence.

2-dimensional NMR measurement is realized by repeating the two-dimensional pulse sequence while changing the evolution period $t_1$. FIG. 2 is a schematic diagram thereof. $N_s$ denotes a scan count, and the pulse sequence scan is repeated $N_a$ times with the evolution period $t_1$ fixed. All the detected NMR signals are integrated using a reception processor. For this reason, $N_a$ is called an "integration count." When $N_a$ scans are finished, the evolution period $t_1$ is incremented by an increment $\Delta t_1$ entered by the user beforehand and $N_a$ scans are performed again. 2-dimensional NMR measurement is realized by repeating this process until the evolution period $t_1$ is incremented the number of times entered by the user beforehand, that is, $N_{t1}$ times.

As a result, 2-dimensional NMR measurement requires $N_a \times N_{t1}$ scans. Multi-dimensional NMR measurement generally includes (number of dimensions-1) evolution times and (number of dimensions-1) increment counts Ni's. For example, in the case of 3-dimensional NMR measurement, there are two evolution periods (times) of $t_1$ and $t_3$ and two increment counts of $N_{t1}$ and $N_{t3}$. The scan count necessary for 3-dimensional NMR measurement is $N_{scan}=N_a \times N_{t1} \times N_{t3}$. When $\Delta_{t1}$ is generalized and called "$\Delta_{ti}$" and $N_{t1}$ and $N_{t3}$ or the like are generalized and called "$N_{ti}$", the number of scans necessary for D-dimensional NMR measurement is on the order of $N_{ti}^{D-1}$.

While multi-dimensional NMR measurement including 2-dimensional NMR measurement has an advantage that resolution is improved and it is possible to elucidate interaction between atomic nuclear spins, it requires several tens to several thousands of scans to obtain a result, which takes a considerable time. The scan count necessary for multi-dimensional NMR measurement increases by increment count $N_{t1}$ to the (number of dimensions-1)th power, and therefore it is important to reduce $N_{ti}$ and the number of dimensions in multi-dimensional NMR measurement.

In order to reduce $N_{ti}$, folding and aliasing of a signal and a half-dwell detection method are conventionally used. According to the conventional technique described in Ad Bax, Mitsuhiko Ikura, Lewis Kay, and Guang Zhu, Removal of F1 Baseline Distortion and Optimization of Folding in Multidimensional NMR Spectra, Journal of Magnetic Resonance, vol. 91, PP. 174-178 (1991), when $N_{ti}$ is reduced without deteriorating frequency resolution, the observable frequency bandwidth becomes narrower. This results in "folding and aliasing" of a signal on a frequency spectrum in which a signal appears at a frequency different from its original frequency. When folding and aliasing of a signal occurs, a frequency discrimination method for identifying the original frequency of the folded and aliased signal is necessary. The conventional technique uses the half-dwell detection method as the frequency discrimination method.

The half-dwell detection method conducts multi-dimensional NMR measurement with only the first time increment set to half the original increment $\Delta t_i$, that is, $\Delta t_i/2$. According to the half-dwell detection method, when the first acquisition time is changed, the sign of a spectrum whose folding and aliasing count is an odd number is inverted, whereas the sign of a spectrum whose folding and aliasing count is an even number remains unchanged.

Therefore, it is possible to distinguish the folded and aliased spectrum using this difference in the sign. In this way, the conventional technique can reduce $N_{ti}$ and the scan count necessary for multi-dimensional NMR measurement using the signal folding and aliasing and half-dwell detection method without deteriorating frequency resolution or without mistakenly discriminating the signal frequency. The relationship between signal folding and aliasing, $N_{ti}$, frequency resolution and signal frequency discrimination is explained in John Cavanagh, Wayne J. Faribrother, Arthur G. Palmer III, and Nicholas J. Skelton, CHAPTER 4, Multidimensional NMR Spectroscopy, PP. 227-236 (Academic Press, 1995).

The conventional method using the signal folding and aliasing and half-dwell detection can distinguish whether a folding and aliasing count is an odd number or even number, but cannot distinguish the folding and aliasing count. Therefore, even under an optimal condition, the available folding and aliasing count is once at most. In the conventional technique using folding and aliasing, it is basically impossible to reduce $N_{ti}$ to less than ½ through predetermined NMR measurement alone without any problem with a spectral analysis.

When signals overlap due to folding and aliasing, there is another problem that it is difficult to decide signal signs.

Overlapping of signals is more likely to occur as a spectrum becomes more complex, and therefore it is particularly difficult to decide folding and aliasing using signal signs particularly for high polymers having a complex spectrum. Avoiding this problem requires folding and aliasing to be reduced, and therefore it is actually difficult for the conventional technique to reduce $N_{ti}$ to close to /1;2.

The technique of deciding folding and aliasing using sign inversion of signals is effective for a conventional NMR apparatus having a low signal to noise ratio. Since $N_{scan}$ needs to be increased to complement a low signal to noise ratio, it is a signal to noise ratio and not $N_{ti}$ of multi-dimensional measurement that constitutes a major factor in determining $N_{scan}$. For this reason, there has been no need to reduce $N_{ti}$ to close to /1;2 or below /1;2.

However, the signal to noise ratio of the NMR apparatus has been improved considerably and it is necessary to drastically reduce $N_{ti}$ compared to the conventional technique in order to improve the throughput of multi-dimensional NMR measurement. It is an object of the present invention to provide a measurement method and apparatus capable of reducing N to ½ with only predetermined NMR measurement without any problem with spectral analysis, and reduce a scanning count necessary for multi-dimensional NMR measurement and improve the throughput of multi-dimensional NMR measurement.

SUMMARY OF THE INVENTION

One of means for solving the problem according to the present invention is an NMR measurement method using an NMR apparatus which converts a received signal to digital data using an analog/digital converter and performs a spectral analysis, characterized by conducting frequency discrimination by deciding a folding and aliasing count from a variation in a peak frequency. Furthermore, in this measurement method, a Nyquist frequency is changed to cause a variation in a peak frequency. Furthermore, the Nyquist frequency is changed in such a way that the ratio between different Nyquist frequencies is not the ratio between natural numbers n1 and n2 which is greater than 0 and smaller than or equal to a maximum folding and aliasing count.

In the case of the multi-dimensional NMR measurement method in particular, a Nyquist frequency is inversely proportional to an increment of the evolution time, which is a feature of multi-dimensional NMR, and therefore changing the increment of the evolution time makes it possible to change the Nyquist frequency. In the NMR apparatus which executes the NMR measurement method characterized by deciding a variation of a folding and aliasing count from a variation of the peak frequency, conducting frequency discrimination and causing a variation of the peak frequency by the variation of the Nyquist frequency, the control software installed in this apparatus automatically changes the Nyquist frequency during NMR measurement according to a user's selection.

The ratio between the Nyquist frequency changed by software operation and Nyquist frequency before the change is characterized by not being the ratio between natural numbers n1 and n2 which is greater than 0 and smaller than or equal to a maximum folding and aliasing count. Furthermore, the above described software includes a screen which displays a plurality of spectra obtained at different Nyquist frequencies together to decide the difference therebetween. Furthermore, the above described software also includes a spectral screen for calculating the original frequency of a signal from the folding and aliasing count and Nyquist frequency and displaying the original frequency expanded up to the original frequency area with no folding and aliasing.

The expanded spectral screen is characterized by being able to display a plurality of expanded spectra together, compare original signal frequencies obtained by calculations and thereby confirm the accuracy of expanded spectra. When the accuracy of the expanded spectrum is decided to be insufficient, measurement is conducted using a Nyquist frequency which is different from the Nyquist frequency used to obtain an expanded spectrum in order to improve the accuracy of the expanded spectrum. As another method for improving the accuracy of the expanded spectrum, the software may also measure a signal at a time point different from the time point at which measurement is conducted to obtain the expanded spectrum, obtain interpolation data and apply a technique for optimizing the numerical analysis to data including the interpolation data.

According to one method of the present invention for solving the problem, it is possible to reduce N to ½ by predetermined NMR measurement alone without any problem with a spectral analysis. As a result, it is possible to reduce a scan count necessary for multi-dimensional NMR measurement and improve the throughput of the multi-dimensional NMR measurement.

Other objects, features and advantages of the invention will become apparent from the following description of the embodiments of the invention taken in conjunction with the accompanying drawings.

DETAILED DESCRIPTION OF THE INVENTION

As a preferred embodiment in implementing the present invention, a simple method for discriminating a folding and aliasing count of a signal in indirect dimension in multi-dimensional NMR measurement will be disclosed.

Figure 1:
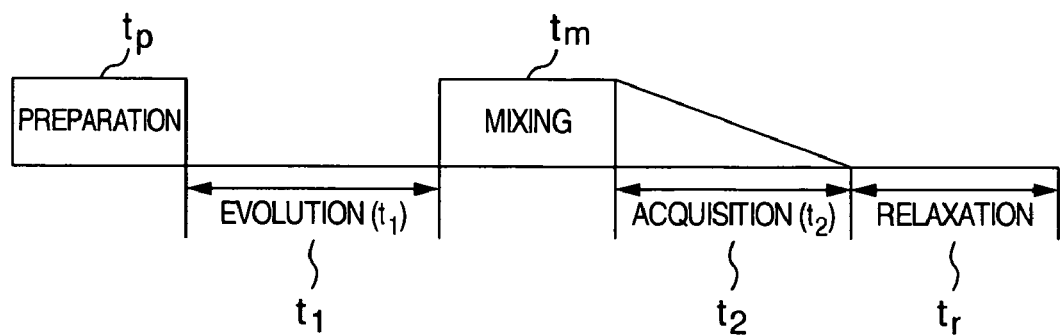
FIG. 1 is a configuration diagram of a pulse sequence used for 2-dimensional NMR measurement.
Figure 2:
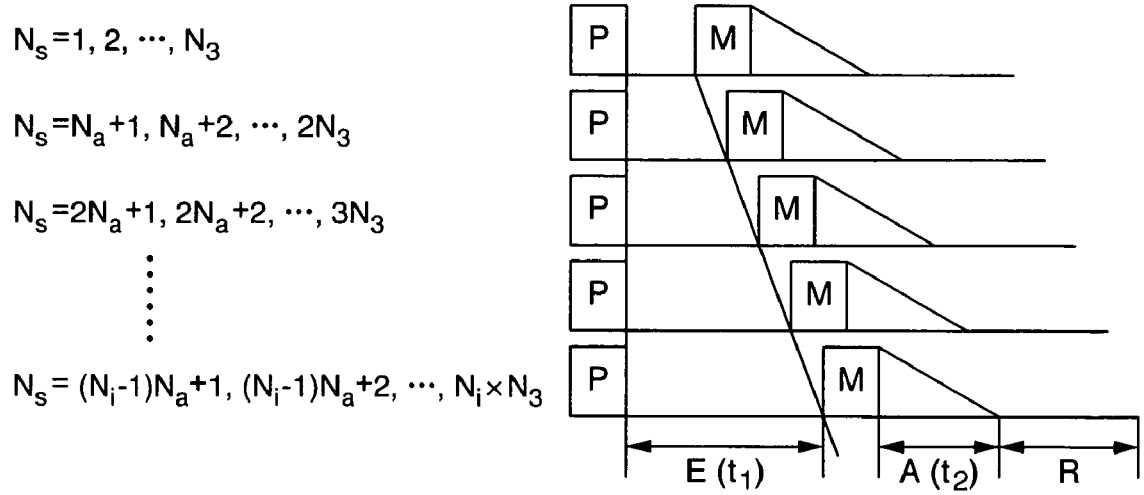
FIG. 2 is a conceptual diagram of 2-dimensional NMR measurement.
Figure 3:
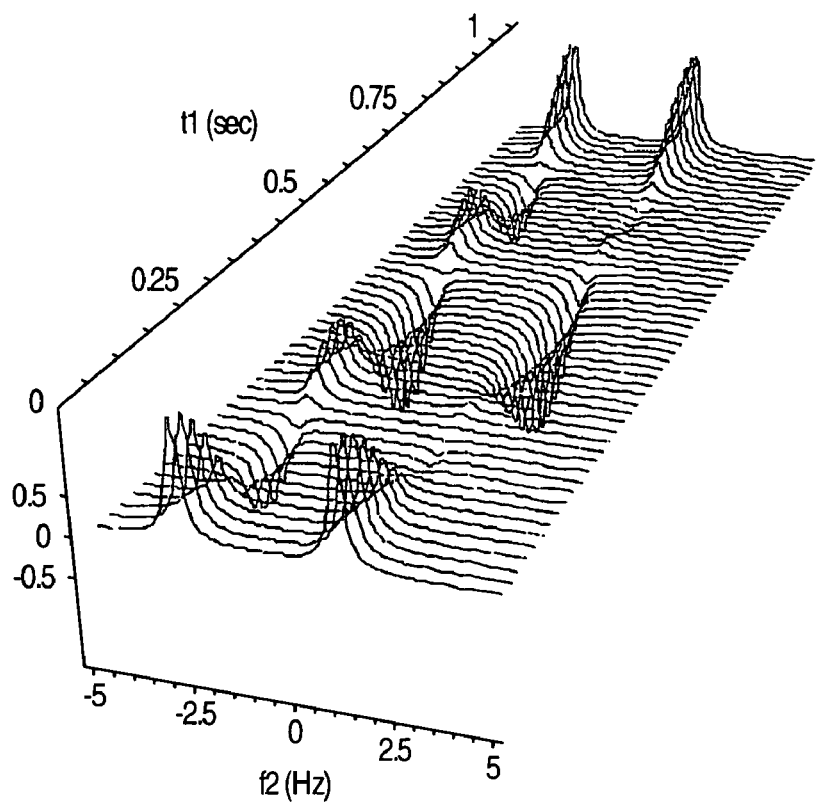
FIG. 3 is data of 2-dimensional NMR measurement.

The indirect dimension refers to a dimension of a frequency axis obtained by applying a Fourier transform to a group of data obtained in multi-dimensional NMR measurement in the direction of an evolution period t1. The evolution period t1 in FIG. 3 shows an example thereof. FIG. 3 is a figure called "interferogram" and obtained by subjecting the group of data acquired by the 2-dimensional NMR measurement shown in FIG. 2 to a Fourier transform every evolution time t1 and rearranging the data.

In a two-dimensional spectrum obtained by further subjecting the interferogram in FIG. 3 to a Fourier transform in the direction of the evolution period t1, the frequency axis obtained by the Fourier transform of the evolution period t1 is the indirect dimension. As described in John Cavanagh, Wayne J. Faribrother, Arthur G. Palmer III, and Nicholas J. Skelton, CHAPTER 4, Multidimensional NMR Spectroscopy, PP. 227-236 (Academic Press, 1995), frequency resolution $\Delta f_i$ in indirect dimension is equal to $1/(N_{ti} \times \Delta t_i)$ and the frequency bandwidth in the same dimension is $-1/(2\Delta t_i)$ to $1/(2\Delta t_i)$.

Therefore, in order to reduce $N_{ti}$ without deteriorating frequency resolution, $\Delta t_i$ needs to be increased. As a result, the frequency bandwidth is narrowed and the signal is folded and aliased with respect to the indirect dimension. The mode of such folding and aliasing may be divided depending on the detection method in the indirect dimension set by the user. These are a case such as a States method or TPPI-States method where a detection method of acquiring a signal in indirect dimension as a complex number is specified and a case such as a TPPI method where a detection method of acquiring a signal in indirect dimension as a real number is specified.

When the detection method of acquiring a signal in indirect dimension as a complex number or real number is specified, the relationship between an appearance frequency $W_a$ by folding and aliasing and a true frequency $W_o$ is as shown in Expressions (1) and (2).

$$W_a = W_o - 2m \times F_N \quad (1)$$

$$W_a = (-1)^m (W_o - 2m \times F_N) \quad (2)$$

where m is a folding and aliasing count and $F_N$ is a Nyquist frequency $1/(2\Delta t_i)$. Expression (1) is described in John Cavanagh, Wayne J. Faribrother, Arthur G. Palmer III, and Nicholas J. Skelton, CHAPTER 4, Multidimensional NMR Spectroscopy, PP. 227-236 (Academic Press, 1995) as an expression showing the relationship between the true frequency $W_o$ and appearance frequency $W_a$ when the signal is acquired with a frequency bandwidth $F_N$.

An embodiment of the present invention has noticed that when the Nyquist frequency $F_N$ is changed in Expression (1), the frequency $W_a$ is also changed. Expression (3) shows a difference in appearance frequency $\Delta W_a$ between two different Nyquist frequencies $F_{N,1}$ and $F_{N,2}$.

$$\Delta W_a = 2((m_1 \times F_{N,1} m_2 \times F_{N,2}) \quad (3)$$

$m_1$ and $m_2$ are folding and aliasing counts of $F_{N,1}$ and $F_{N,2}$. Since the true frequency $W_o$ does not change even when the Nyquist frequency $F_N$ is changed, no frequency $W_o$ appears in Expression (3). In Expression (3), the Nyquist frequencies $F_{N,1}$ and $F_{N,2}$ are parameters set by the user. Furthermore, the appearance frequency difference $\Delta W_a$ is an experimental amount obtained by measurement. Therefore, Expression (3) includes two unknowns of the folding and aliasing counts $m_1$ and $m_2$. If there is some method for determining the folding and aliasing counts $m_1$ and $m_2$ from Expression (2), it is possible to discriminate the folding and aliasing count and attain the object of the present invention.

Hereinafter, conducting a plurality of measurements with different Nyquist frequencies $F_N$ will be called "modulation measurement", and the measurement method of discriminating a folding and aliasing count and frequencies from modulation measurement will be called a "modulation measurement method." An effective fact in determining the folding and aliasing counts $m_1$ and $m_2$ is that the folding and aliasing counts $m_1$ and $m_2$ necessarily belong to natural numbers. Furthermore, to clarify the relationship between the folding and aliasing counts $m_1$ and $m_2$, Expression (3) may be rewritten as Expression (4).

$$m_1 = \frac{F_{N,2}}{F_{N,1}} m_2 - \frac{F_{N,2}}{2F_{N,1}^2} \Delta W_a \quad (4)$$

Expression (4) clearly shows that the folding and aliasing counts $m_1$ and $m_2$ have a linear relationship. Though Expression (4) has a condition that the folding and aliasing counts $m_1$ and $m_2$ are natural numbers, by eliminating this condition, it is possible to obtain a linear function of Expression (5). Then, the folding and aliasing counts $m_1$ and $m_2$ can be determined by finding Y corresponding to a natural number X from Expression (5) and finding a pair (X,Y) when Y becomes a natural number.

$$Y = aX + b_o, \ a = F_{N,2}/F_{N,1}, b_o = a \times \Delta W_a/(2F_{N,1}) \quad (5)$$

Figure 4:
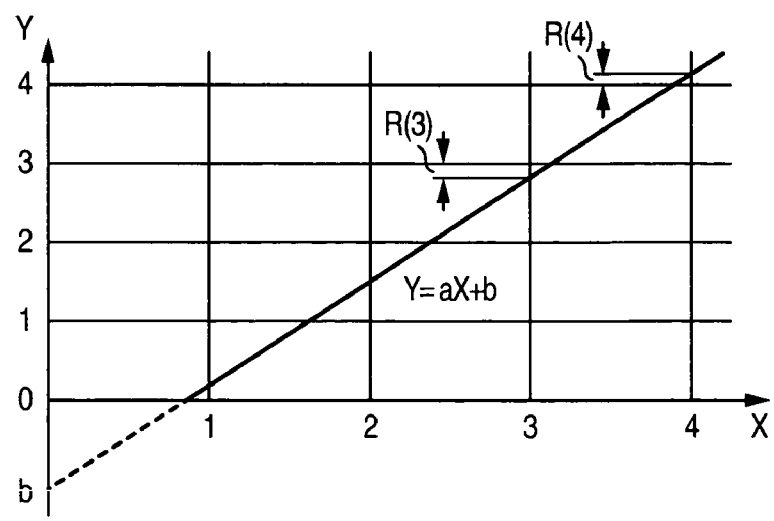
FIG. 4 illustrates a frequency discrimination method by modulation measurement according to an embodiment of the present invention.

FIG. 4 shows an example of a method using Expression (4) concerning the determination of the folding and aliasing counts $m_1$ and $m_2$. The Y value is calculated by incrementing X by 1 at a time from X=0 to a maximum value 4 according to the linear function defined in Expression (5). Suppose the distance between the Y value corresponding to X=n and the nearest natural number is R(n). Then, R becomes a minimum when n=4 in the example of FIG. 4. Therefore, $m_2$=4, $m_1$=4 are determined. According to this method concerning the determination of the folding and aliasing counts $m_1$ and $m_2$, the folding and aliasing count can be discriminated by only inputting a predictable maximum value of the folding and aliasing count and conducting measurement with different Nyquist frequencies $F_N$. However, a precondition is that a should not be a rational number that satisfies the following condition.

$$a = \frac{n_1}{n_2}, n_1, n_2 \in N \text{ and } 0 < n_1, n_2 \leq m_{max} \quad (6)$$

$m_{max}$ is a maximum folding and aliasing count and a natural number obtained by dividing a maximum reception bandwidth which is the specification of the NMR apparatus by $2F_N$ and rounding up the division result. This is because when a that satisfies Expression (6) is used, there necessarily are a plurality of n's having equal R.

It is also possible to discriminate the folding and aliasing count using another method by explicitly taking in an error in Expression 5. In Expression 5, an error between Nyquist frequencies $F_{N,1}$ and $F_{N,2}$ which are parameters set by the user can be ignored. On the other hand, since the appearance frequency difference $\Delta W_a$ is an experimental amount obtained through measurement, it includes an error $\epsilon$ as shown in Expression 6. The superscript e denotes an experimental amount.

$$\Delta W_a^e = \Delta W_a + \epsilon \quad (7)$$

When the left side of Expression (7) is substituted into $\Delta W_a$ of Expression (5), the only influence of the error $\epsilon$ is that the intercept of Y of Expression (5) changes as shown in Expression (8).

$$b = b_0 + \frac{a}{2F_{N,1}} \varepsilon \quad (8)$$

From Expressions (4), (5), (7), the error $\epsilon$ is equal to a measured value $\Delta W_a^e$ of the signal with $m_1 = m_2 = 0$.

In NMR measurement, it is possible to identify the signal with $m_1 = m_2 = 0$ before the measurement. This is because part of the signal received can be known with the accuracy of ±10 Hz or higher before the frequency thereof is measured such as the frequency of a signal output from a solvent which dissolves a sample, for example. By setting irradiation and a detection frequency so that the frequency of the signal satisfies $m_1 = m_2 = 0$, the error $\epsilon$ can be calculated from the experimental amount. Therefore, by finding n that satisfies the condition of Expression (9), the method of determining the folding and aliasing counts $m_1$ and $m_2$ is also available.

$$R(n) \leq \frac{a}{2F_{N,1}} \varepsilon \quad (9)$$

Expression (9) shows that it is also possible to reduce the influence of the experimental error $\epsilon$ by adopting a Nyquist frequency $F_{N,1}$ which is sufficiently greater than a.

Figure 5:
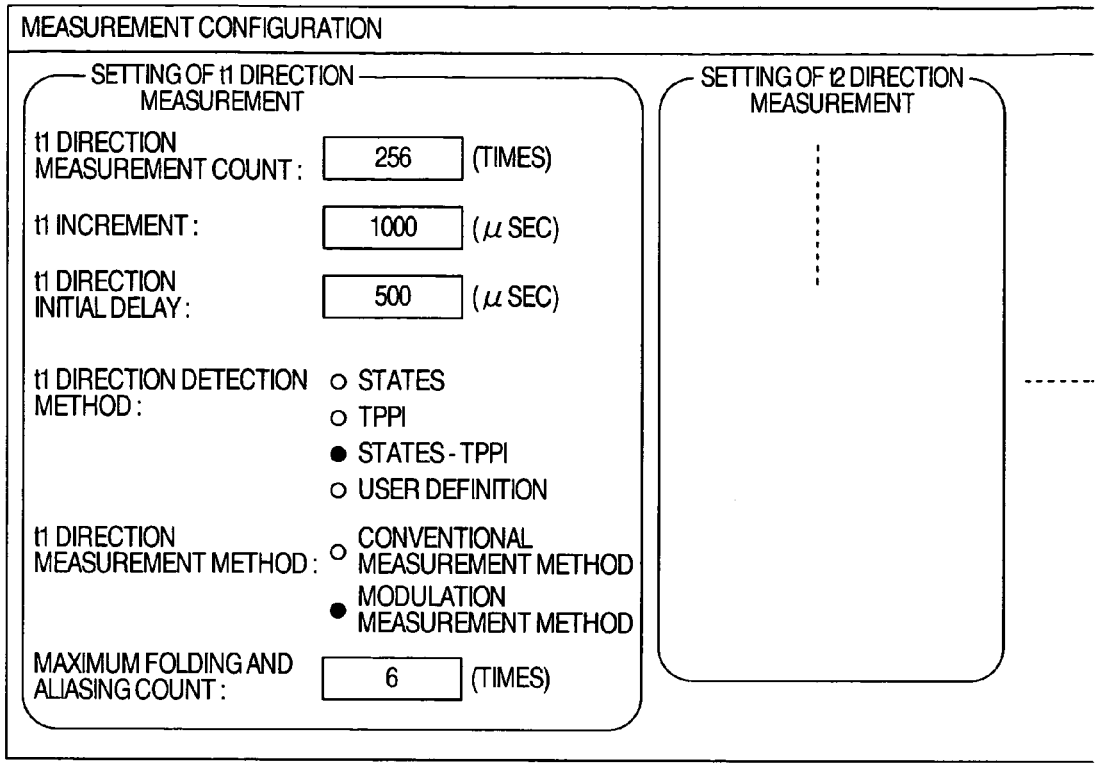
FIG. 5 is a measurement parameter setting screen according to the above described embodiment of the present invention.

FIG. 5 shows an example of a setting screen according to an embodiment of the present invention. The screen for making various settings necessary for multi-dimensional NMR measurement includes a setting associated with measurement of the evolution period t1 direction which is indirect dimension. The measurement setting of the evolution period t1 direction in FIG. 5 represents the setting of indirect dimension measurement. Indirect dimension setting items include a measurement method or a similar item and it is possible to select the conventional measurement method and the modulation measurement method disclosed in the present invention. Settings other than the indirect dimension measurement method can be the same as the conventional ones.

Figure 6:
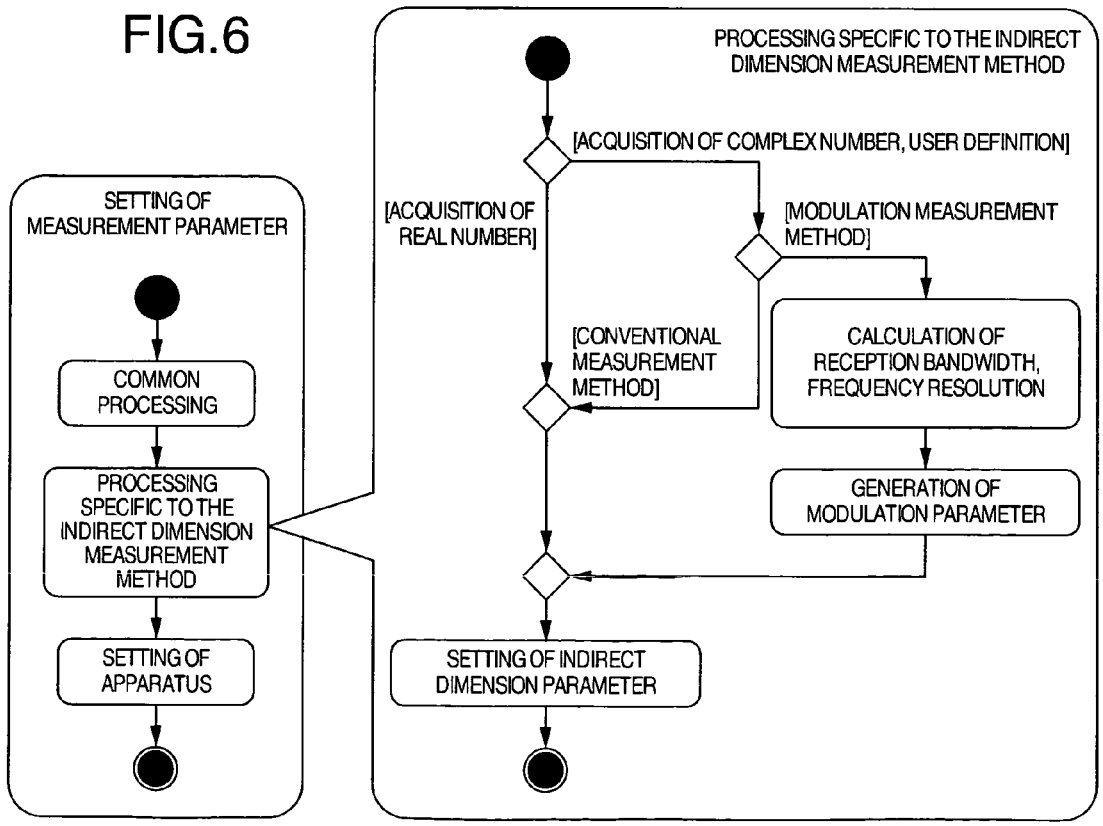
FIG. 6 is a flow chart showing measurement parameter setting processing according to the above described embodiment of the present invention.

The setting contents entered by the user using the setting screen shown in FIG. 5 are processed as shown in FIG. 6 by an NMR apparatus or software installed in a computer for control. FIG. 6 described in the format of a UML activity view will be explained below.

In a common processing stage, parameters common to the conventional measurement method and modulation measurement method are processed. The processing contents may be a conversion of the settings of, for example, frequency, phase, delay width, amplitude and output level to words equivalent to input numerical values. The settings associated with the indirect dimension measurement method, for example, measurement count of the evolution period t1 direction $N_{ti}$, increment $\Delta t_i$ of the evolution period t1 or the like are processed by the next processing specific to the indirect dimension measurement method.

In the stage of the processing specific to the indirect dimension measurement method, it is first decided whether the settings on the previous setting screen satisfy the condition under which the modulation measurement method is applied or not.

When TPPI which is acquisition of a real number is selected as the indirect dimension detection method, measurement is conducted using the conventional measurement method regardless of the setting of the measurement method. When other detection methods, that is, States, TPPI-States, user definition are selected, the measurement method is decided. When the modulation measurement method is selected as the measurement method, reception bandwidth $SW = -1/(2\Delta t_i)$ to $1/(2\Delta t_i)$ specified by the user for automatic processing and frequency resolution $dW = 1/(N_{ti} \times \Delta t_i)$ are calculated. In the next modulation parameter generation stage, $\Delta t_{i,1}$, $\Delta t_{i,2}$ and $N_{ti,1}$, $N_{ti,2}$ are generated from the reception bandwidth SW and frequency resolution dW.

With respect to the maximum folding and aliasing count $m_{max}$ set on the setting screen, $\Delta t_{i,1} = m_{max} \times \Delta t_i$ and $N_{ti,1} = 1/(dW \times \Delta t_{i,1})$. In the case where $N_{ti,1}$ is not a natural number, it is rounded up to a natural number. $\Delta t_{i,2} = \Delta t_{i,1}/a$ and a is a real number that does not satisfy Expression (6) where $1 < a < m_{max}$. $N_{ti,2}$ is a natural number obtained by rounding up $1/(dW \times \Delta t_{i,2})$. In the final indirect dimension parameter setting stage, $\Delta t_i$ and $N_{ti,1}$ are converted to words defined by the NMR apparatus and added to the words output in the common processing stage. The use of $\Delta t_{i,2}$ and $N_{ti,2}$ will be explained below.

When the States (TPPI) detection method is selected or when the conventional measurement method is selected as the measurement method, $\Delta t_i$ and $N_{ti}$ obtained from the reception bandwidth $SW = -1/(2\Delta t_i)$ to $1/(2\Delta t_i)$ specified by the user and frequency resolution $dW = 1/(N_{ti} \times \Delta t_i)$ are converted to words and added to the words output in the common processing stage.

The last part of the measurement parameter setting shown in FIG. 6 is a stage in which the words obtained in the common processing and processing specific to the indirect dimension measurement method are sent to the NMR apparatus and the apparatus is set. By executing the processing shown in FIG. 6, it is possible to increase the speed of multi-dimensional NMR without causing the user to edit the pulse sequence or considerably increasing the setting burden. In the settings and processing in FIG. 5 and FIG. 6, the added user setting items are only two; the measurement method in indirect dimension and the maximum folding and aliasing count.

Note that it is also possible to execute processing using a procedure different from the procedure shown in FIG. 6. For example, it is also possible to execute the common processing and processing specific to the indirect dimension measurement method in reverse order. Furthermore, it is also possible to transmit the words output through the common processing and processing specific to the indirect dimension measurement method to the respective apparatuses without connecting them and perform setting.

Figure 7:
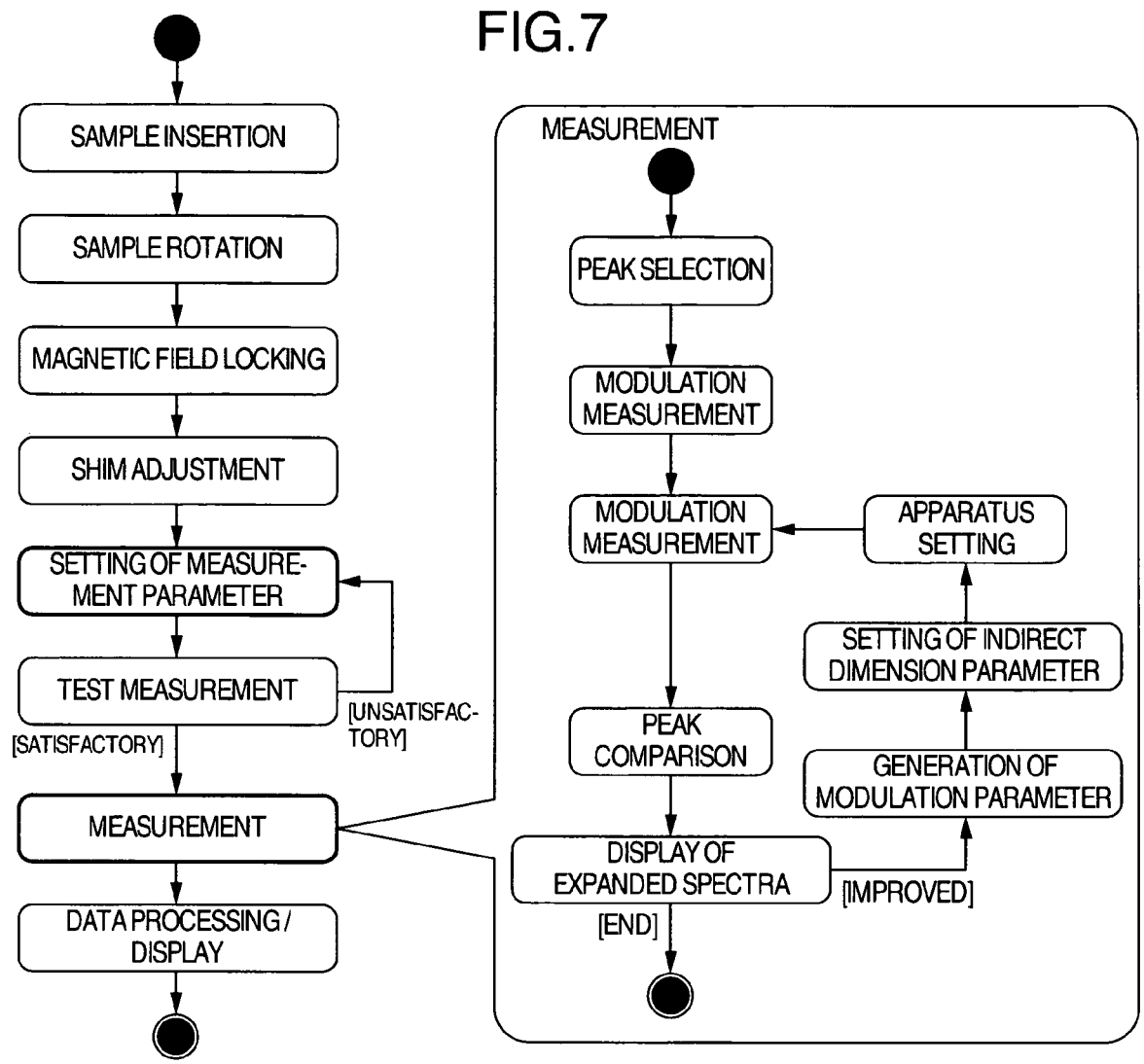
FIG. 7 is a flow chart showing an overall flow of NMR measurement according to the above described embodiment of the present invention.

FIG. 7 shows the overall operation flow of NMR measurement including the measurement parameter setting explained above and the operation flow in the measurement stage according to the modulation measurement method disclosed in the embodiment of the present invention shown in the format of a UML activity view. In this series of operations, the parts that are modified by the high-speed system disclosed in the present invention are enclosed with thick lines. The user inserts a sample tube into a probe and rotates the sample tube. Next, magnetic field locking is performed whereby the next magnetic field of the magnet is matched to the transmission/reception frequency.

Figure 12:
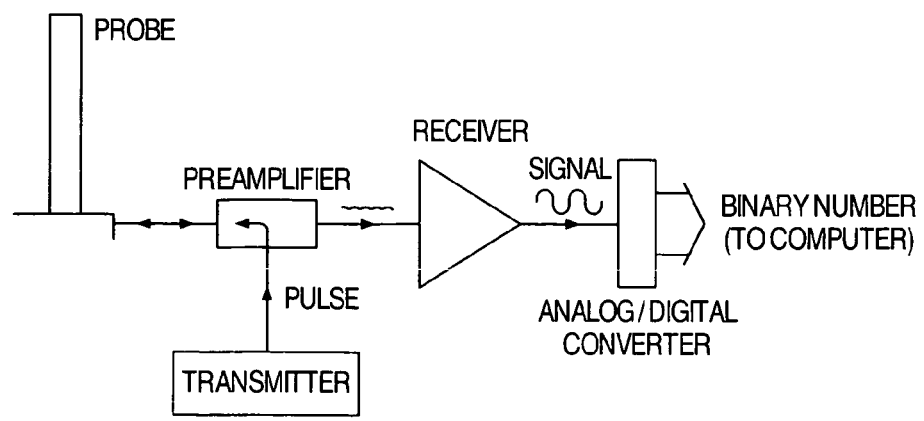
FIG. 12 is a block diagram showing part of an MNR measurement apparatus to which the present invention is applicable.

Then, a shim adjustment is performed. A shim refers to a group of coils set in the magnet and shim adjustment is an operation to adjust a current flowing through the coil group and improve the uniformity of the magnetic field peripheral to the sample tube. FIG. 12 is a block diagram showing part of the MNR measurement apparatus to which the present invention is applicable and the sample tube is inserted into the probe and rotated.

A transmitter and receiver are connected to the probe via a preamplifier and a signal detected is sent to an analyzer via an analog/digital converter. The probe measurement parameter setting has already been explained using FIG. 5 and FIG. 6. The setting contents are tested in a test measurement stage and when a satisfactory result is obtained, a measurement stage is started. Only the operation when the modulation measurement method is applied will be explained below.

In the measurement stage, a peak of interest is selected from measurement data first. The measurement data used in this case may be data obtained through satisfactory test measurement or data obtained by new measurement. When a peak is selected, modulation measurement is started. In the modulation measurement, multi-dimensional measurement is carried out using $\Delta t_{i,1}$ and $N_{ti,1}$ output in the stage of measurement parameter setting first. Next, second modulation measurement is performed. In the second modulation measurement, multi-dimensional measurement is performed using the above described $\Delta t_{i,2}$ and $N_{ti,2}$.

In the peak comparison, the spectrum obtained by the second modulation measurement is used and a measured value $\Delta W_a^e$ which is a difference in the appearance frequency is calculated from the position of the preselected peak.

Figure 8:
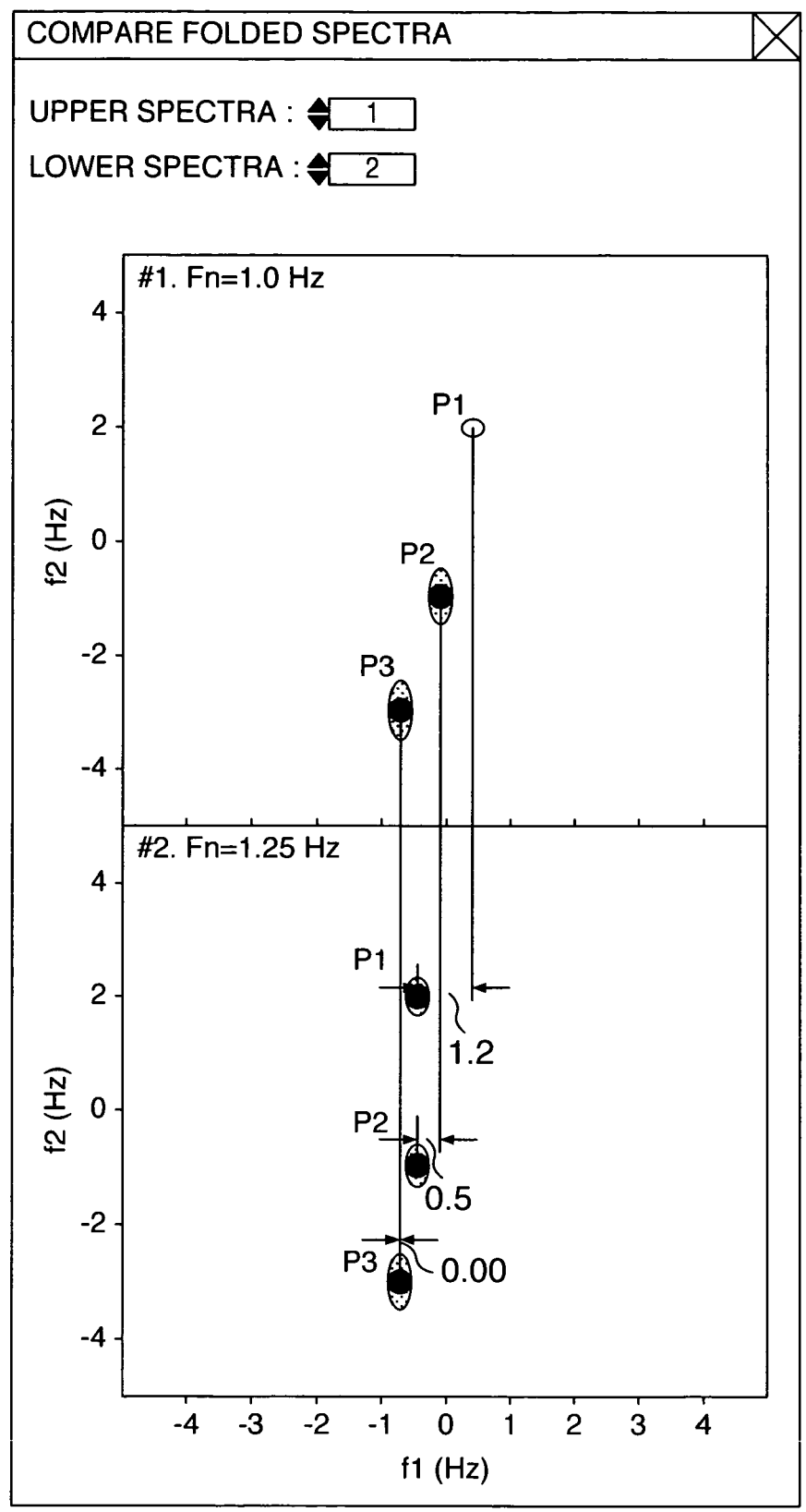
FIG. 8 is a screen displaying a modulation measurement result according to the above described embodiment of the present invention.

FIG. 8 shows an example of a peak comparison screen. Two or more multi-dimensional spectra can be displayed inside a peak comparison window and each window is provided with a menu to select a spectrum to be displayed. In the example of FIG. 8, the spectrum obtained in the first modulation measurement is shown in the upper part and the spectrum obtained in the second modulation measurement is shown in the lower part.

A peak number given when the peak is selected appears in the spectrum and an appearance frequency difference $\Delta W^{ae}$ between peaks of the upper and lower spectra having the same number is displayed. In the display of expanded spectra, the folding and aliasing count and frequency are discriminated using the above described $\Delta W_a^e$ and Expression 5 and the true frequency $W_o$ obtained is displayed.

Figure 9:
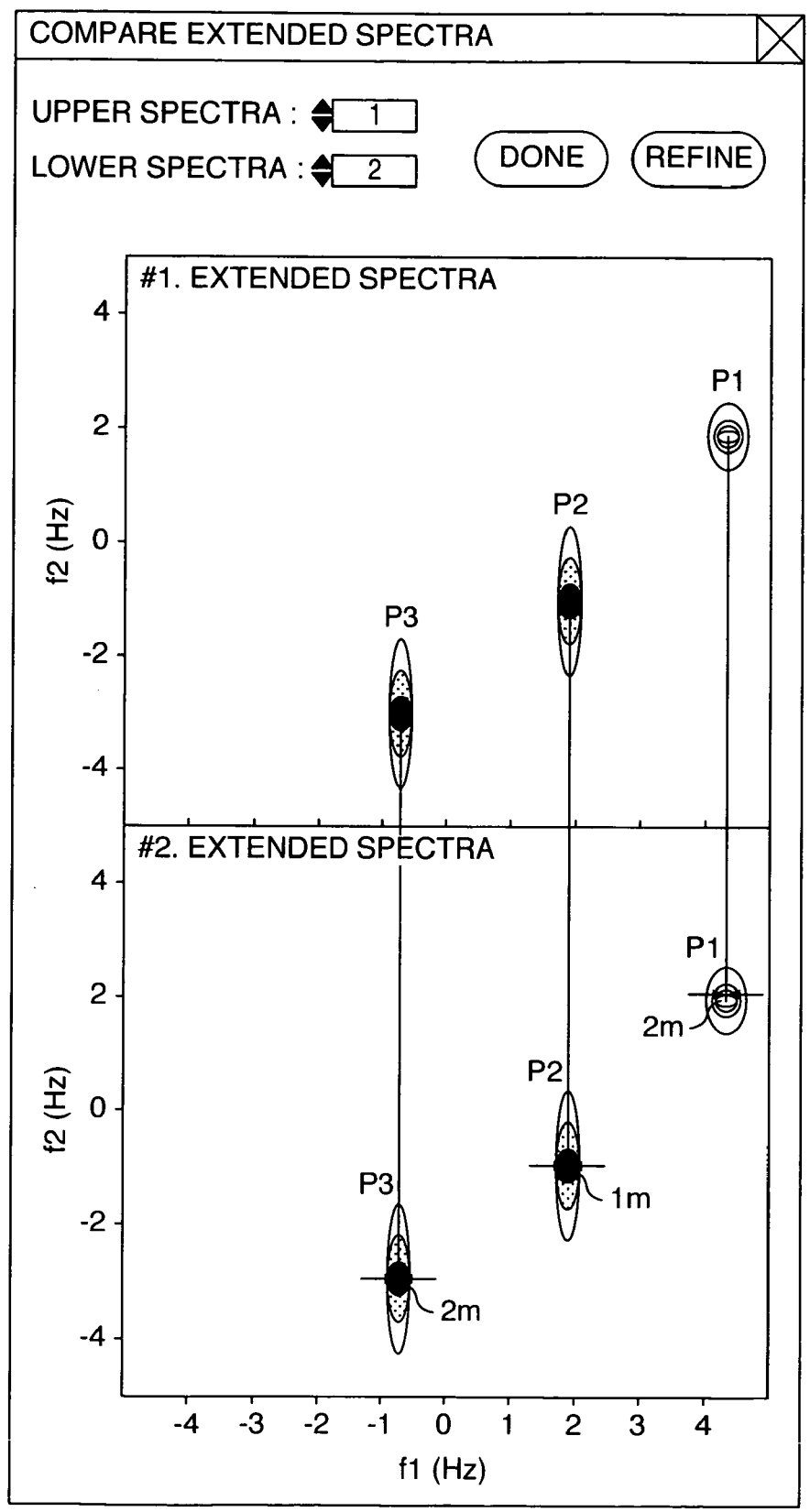
FIG. 9 shows a screen displaying an expanded spectrum according to the above described embodiment of the present invention.
Figure 13A:
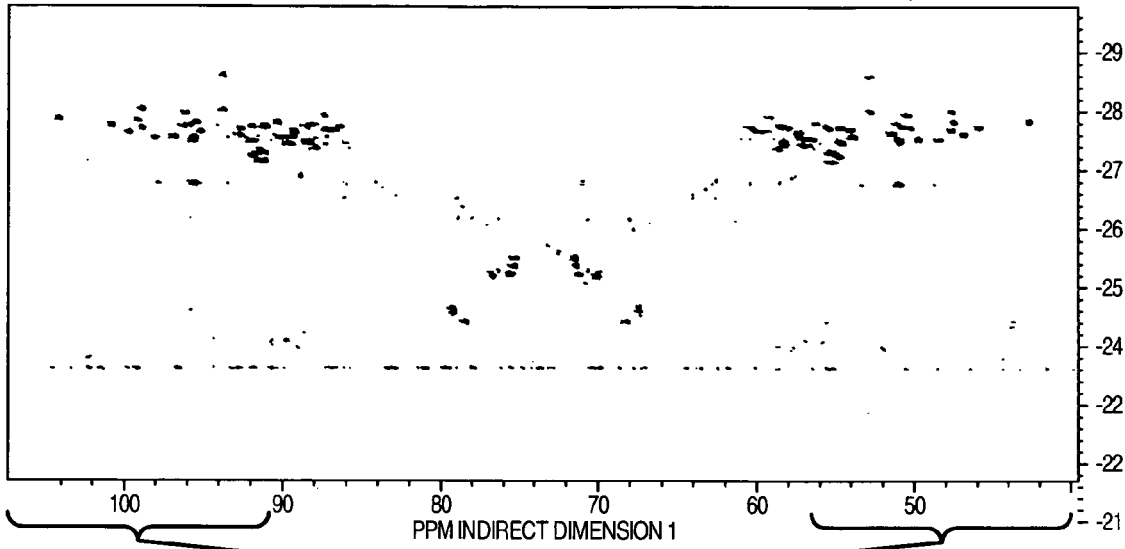
FIGS. 13A-13C are data showing actual folding and aliasing.
Figure 13B:
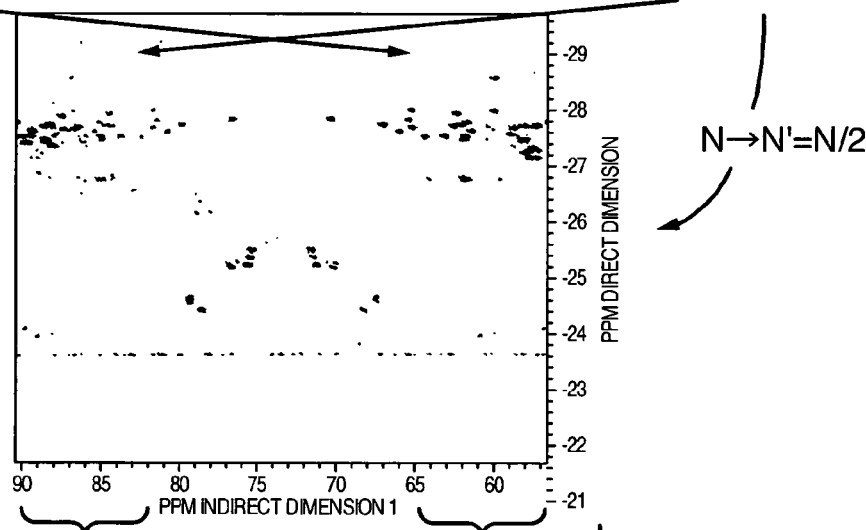
Figure 13C:
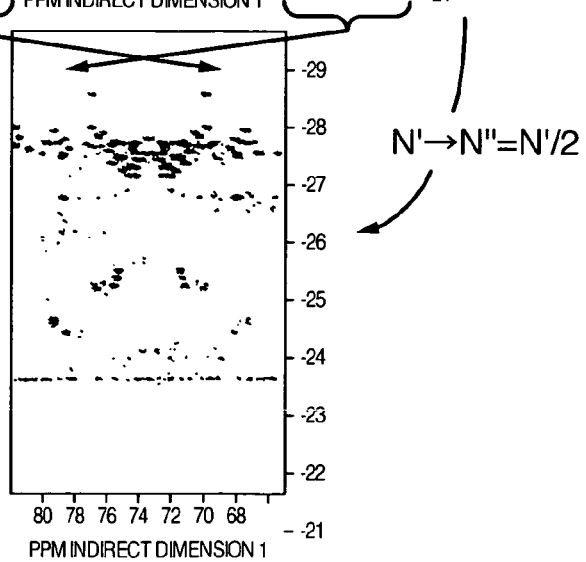

FIGS. 13A-13C show an example of folding and aliasing, FIG. 13A shows a case where no folding and aliasing occurs, FIG. 13B shows a case where folding and aliasing occurs one time and FIG. 13C shows a case where folding and aliasing occurs two times. An example of the display screen of expanded spectra is shown in FIG. 9. FIG. 9 shows a plurality of expanded spectra in a window configuration similar to that of FIG. 8 and shows a difference in the true frequency $\Delta W_o^e$.

When modulation measurement is carried out only twice, only one expanded spectrum exists, and therefore $\Delta W_o^e$ cannot be displayed. When $\Delta W_o^e$ is displayed, the user references $\Delta W_o^e$ to decide whether to finish measurement or continue modulation measurement.

Depending on the decision, the user presses the "Done" button to finish the measurement and clicks on the "Refine" button to continue. When the "Refine" button is clicked, a modulation parameter is generated and an indirect dimension parameter setting and apparatus setting are performed as in the case of the measurement parameter setting stage. Next, a modulation measurement is carried out again.

The decision in the expanded frequency display stage may also be automated using Expression (9). When the decision is automated, it is advantageous for unattended measurement. For automation, the $\epsilon$ value needs to be specified. As the $\epsilon$ value, the user may directly enter it or a measured value may be used. When a measured value is used, a peak without folding and aliasing may be specified when selecting the peak. As described above, in NMR measurement, there is a signal which allows the range of the signal frequency to be recognized beforehand from the characteristic, and therefore it is quite possible to specify a peak with no folding and aliasing.

$\Delta W_a^e$ indicated by the peak with no folding and aliasing may be used as $\epsilon$.

Figure 10:
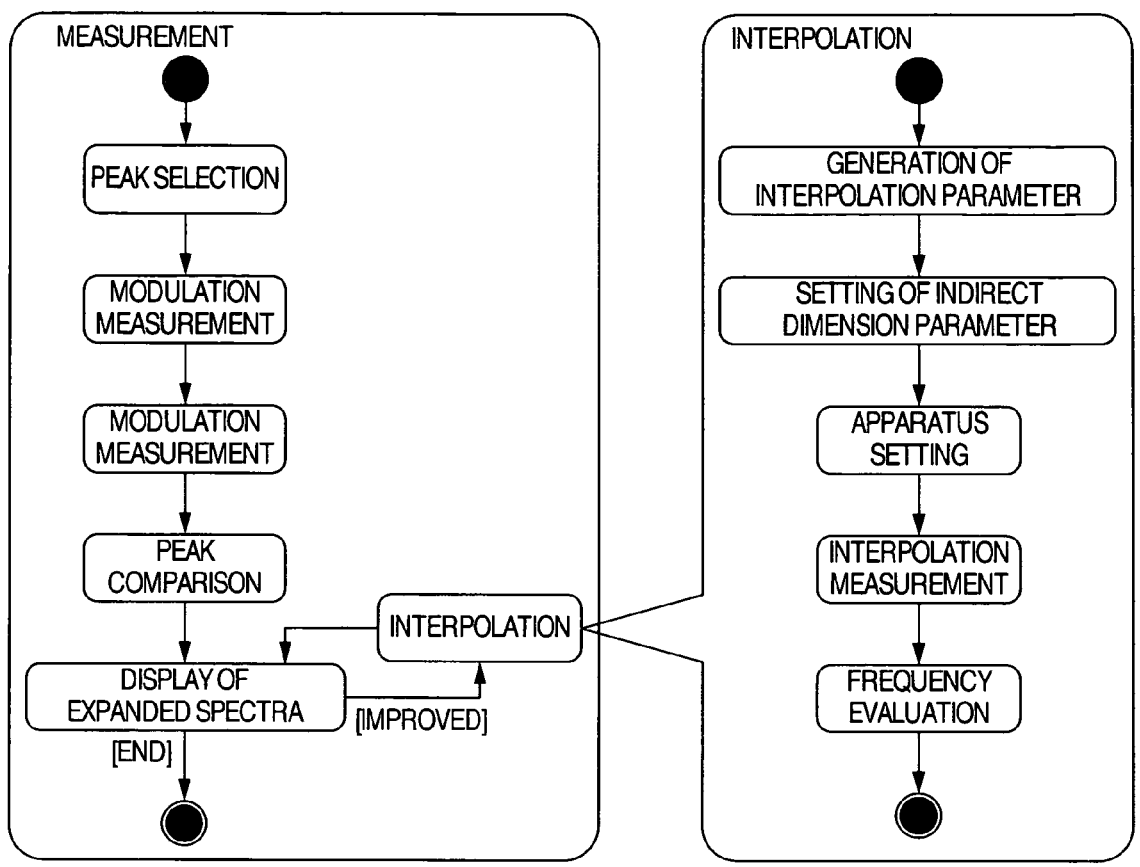
FIG. 10 is a flow chart showing processing during measurement according to Embodiment 2 of the present invention.

Another preferred embodiment of the present invention will be explained below. The difference between Embodiment 2 and Embodiment 1 is the operation when the "Improve" button is clicked in the display of expanded spectra. The difference between Embodiment 2 and Embodiment 1 is shown in FIG. 10. The difference is obvious when compared with the processing in the measurement stage in the modulation measurement method shown in FIG. 7.

In Embodiment 2, when the "Improve" button is clicked, interpolation measurement is performed without performing modulation measurement again. The interpolation measurement is performed one or more times using the evolution time ti not measured in the modulation measurement and is different from modulation measurement in which the Nyquist frequency is changed and overall multi-dimensional NMR measurement is performed.

The interpolation measurement is also different from an integration used in the conventional measurement method in that measurement is performed using an unmeasured, new evolution time. In the interpolation parameter generation stage in FIG. 10, an evolution time $t_{i,New}$ until which no measurement is performed is generated $t_{i,New}$ is converted to a word and the stage in which the apparatus setting is performed is the same as that explained in FIGS. 6, 7. Actual measurement is performed using $t_{i,New}$ in the next interpolation measurement stage.

Figure 11:
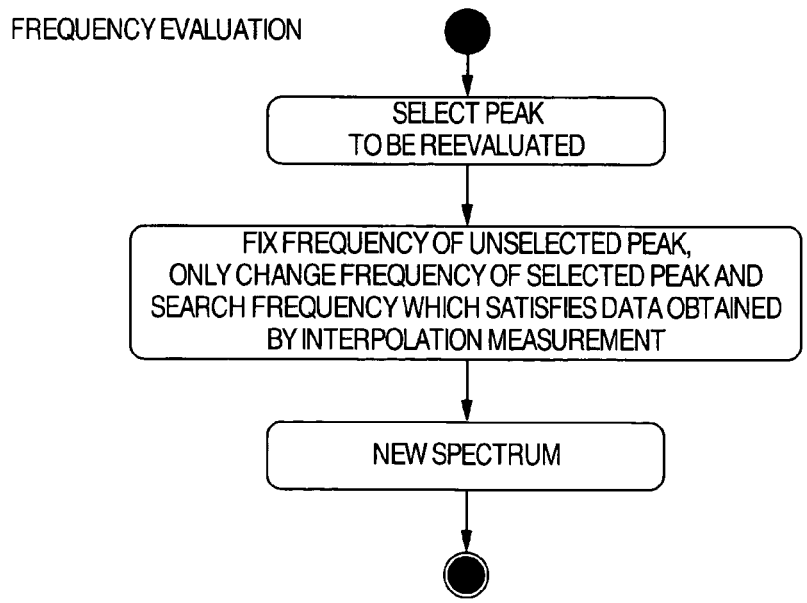
FIG. 11 is a flow chart showing processing during a frequency evaluation according to Embodiment 2 of the present invention.

In the frequency evaluation stage, using the result of interpolation measurement and the expanded spectrum up to that time point, frequency discrimination is performed using a numerical analysis. FIG. 11 shows an example of processing in a frequency evaluation. A first stage of the frequency evaluation is to select peaks to be reevaluated. The peaks to be reevaluated may be directly selected by the user or automatically selected by software.

Furthermore, the user may further correct a selection automatically made by software. In the case of automatic selection by software, one or more peaks having the largest peaks of the difference in the true frequency $\Delta W_o^e$ are selected. Next, only the frequencies of the peaks to be reevaluated are used as variables and one-dimensional or multi-dimensional optimization is carried out.

An optimization algorithm is, for example, simplex method or maximum entropy estimation. A new spectrum can be obtained by adding up the peaks reevaluated by the above described optimization and the peaks not selected for reevaluation. Note that it is also possible to use a frequency analysis technique of unequally sampled data, for example, Lomb algorithm and maximum entropy estimation method.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR measurement method using an NMR apparatus which converts a received signal from a probe to digital data using an analog/digital converter and performs a spectral analysis, comprising the steps of:
    obtaining a folding and aliasing count from a variation in a peak frequency due to change in a Nyquist frequency;
    performing frequency discrimination; and
    sending results of the NMR measurement to one of a display device or storage device; and
    wherein a Nyquist frequency is changed to cause a variation in the peak frequency and a ratio between different Nyquist frequencies is not a ratio between natural numbers n1 and n2 which are greater than 0 and smaller than or equal to the maximum folding and aliasing count.

2. The NMR measurement method according to claim 1, wherein the Nyquist frequency is inversely proportional to an increment of an evolution time and the Nyquist frequency is changed by changing the increment of the evolution time.

3. The NMR measurement method according to claim 2, wherein in order to further improve accuracy of a discriminated frequency, measurement is conducted again using a Nyquist frequency not used for the frequency discrimination.

4. The NMR measurement method according to claim 2, wherein in order to further improve accuracy of a discriminated frequency, measurement is conducted using an evolution time not used to acquire data used for the frequency discrimination.

5. An NMR measurement apparatus comprising:
    means for obtaining a folding and aliasing count from a variation of a peak frequency and aliasing count from a variation of a peak frequency due to a change of a Nyquist frequency and performing frequency discrimination;
    means for automatically changing the Nyquist frequency during NMR measurement according to a user's selection; and
    means for outputting results of the NMR measurement to a display device or store a device,
    wherein a ratio between different Nyquist frequencies is not a ratio between natural numbers n1 and n2 which are greater than 0 and smaller than or equal to the maximum folding and aliasing count.

6. The NMR measurement apparatus according to claim 5, wherein a ratio between different Nyquist frequencies is not a ratio between natural numbers n1 and n2 which are greater than 0 and smaller than or equal to the maximum folding and aliasing count and a user interface is provided which displays a plurality of spectra obtained at different Nyquist frequencies together to decide the difference therebetween.

7. The NMR measurement apparatus according to claim 5, wherein a ratio between different Nyquist frequencies is not a ratio between natural numbers n1 and n2 which are greater than 0 and smaller than or equal to the maximum folding and aliasing count and a user interface is provided which calculates an original frequency from a folding and aliasing count and Nyquist frequency and displays the original frequency expanded to an original frequency area without folding and aliasing.

8. The NMR measurement apparatus according to claim 5, wherein a ratio between different Nyquist frequencies is not a ratio between natural numbers n1 and n2 which is greater than 0 and smaller than or equal to a maximum folding and aliasing count, a user interface is provided which calculates an original frequency from a folding and aliasing count m and Nyquist frequency, displays a plurality of expanded spectra expanded to an original frequency area together without folding and aliasing, and compares the expanded spectra with the calculated original signal frequency to thereby allow accuracy of the expanded spectra to be confirmed.

9. The NMR measurement apparatus according to claim 8, wherein measurement is performed using a Nyquist frequency which is different from the Nyquist frequency used to acquire the expanded spectra.

10. The NMR measurement apparatus according to claim 8, wherein accuracy of an expanded spectrum is measured by measuring a signal at a time point which is different from the time point measured to obtain the expanded spectrum, acquiring interpolation data and applying a numerical analysis optimization technique to data including the interpolation data.

* * * * *